(12) United States Patent
Suzuki et al.

(10) Patent No.: US 9,706,657 B2
(45) Date of Patent: Jul. 11, 2017

(54) FLEXIBLE SUBSTRATE AND ELECTRONIC APPARATUS EQUIPPED WITH SAME

(71) Applicant: KYOCERA Corporation, Kyoto-shi, Kyoto (JP)

(72) Inventors: Kengo Suzuki, Ikoma (JP); Kouji Morimoto, Daito (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 14/969,585

(22) Filed: Dec. 15, 2015

(65) Prior Publication Data

US 2016/0105962 A1    Apr. 14, 2016

Related U.S. Application Data

(63) Continuation of application No. PCT/JP2014/065130, filed on Jun. 4, 2014.

(30) Foreign Application Priority Data

Jun. 19, 2013  (JP) .................................. 2013-128143

(51) Int. Cl.
| | |
|---|---|
| H05K 1/00 | (2006.01) |
| H05K 1/11 | (2006.01) |
| H05K 1/02 | (2006.01) |
| H05K 1/18 | (2006.01) |
| H05K 3/28 | (2006.01) |

(52) U.S. Cl.
CPC ............. *H05K 1/118* (2013.01); *H05K 1/028* (2013.01); *H05K 1/189* (2013.01); *H05K 3/281* (2013.01); *H05K 2201/053* (2013.01); *H05K 2201/056* (2013.01); *H05K 2201/10053* (2013.01); *H05K 2201/10189* (2013.01)

(58) Field of Classification Search
CPC ................................ H05K 1/118; H05K 1/028
See application file for complete search history.

(56) References Cited

U.S. PATENT DOCUMENTS 5,408,052 A * 4/1995 Inaba .................. H01L 23/5387
                                                        174/254
5,428,190 A * 6/1995 Stopperan .............. H05K 3/323
                                                        174/250

(Continued)

FOREIGN PATENT DOCUMENTS

| JP | 9-64488 A | 3/1997 |
| JP | 2002-232086 A | 8/2002 |

(Continued)

OTHER PUBLICATIONS

English Translation JP 1997-64488, Cannon.*

(Continued)

*Primary Examiner* — Steven T Sawyer
(74) *Attorney, Agent, or Firm* — Procopio Cory Hargreaves and Savitch LLP

(57) ABSTRACT

A flexible board includes: a base film, on which a wiring pattern is formed; a first cover film, which is located on one surface of the base film; and a second cover film, which is located on the other surface of the base film. The bending portion, which is bent when mounting the flexible board on an electronic apparatus, includes both edges on which the first cover film is formed and a central portion from which the base film is exposed.

5 Claims, 3 Drawing Sheets

(56) References Cited

U.S. PATENT DOCUMENTS

| | | | | |
|---|---|---|---|---|
| 6,017,222 A | * | 1/2000 | Kao | H01R 12/613 |
| | | | | 439/493 |
| 2002/0076960 A1 | * | 6/2002 | Ibaraki | H01R 35/02 |
| | | | | 439/165 |
| 2004/0114063 A1 | * | 6/2004 | Miyamura | H05K 1/028 |
| | | | | 349/58 |
| 2010/0193223 A1 | * | 8/2010 | Bagung | H05K 1/0278 |
| | | | | 174/254 |
| 2012/0142218 A1 | * | 6/2012 | Lin | H01R 12/775 |
| | | | | 439/607.49 |
| 2014/0329569 A1 | | 11/2014 | Kikuchi et al. | |

FOREIGN PATENT DOCUMENTS

| | | |
|---|---|---|
| JP | 2003-110207 A | 4/2003 |
| JP | 2012-239119 A | 12/2012 |

OTHER PUBLICATIONS

International Search Report of the International Searching Authority issued by the Japanese Patent Office for International Application No. PCT/JP2014/065130.

* cited by examiner

FLEXIBLE SUBSTRATE AND ELECTRONIC APPARATUS EQUIPPED WITH SAME

CROSS-REFERENCE TO RELATED APPLICATION

The present is a bypass continuation of International Application No. PCT/JP14/065130 filed on Jun. 6, 2014, which claims the benefit of Japanese Application No. 2013-128143, filed on Jun. 19, 2013. The contents of the above applications are incorporated by reference herein in their entirety.

TECHNICAL FIELD

An embodiment of the present disclosure relates to a flexible board mounted on an electronic apparatus.

BACKGROUND ART

In electronic apparatuses such as a mobile phone or a smartphone, a flexible board (flexible printed circuit board) electrically connecting electronic components is accommodated in a casing.

SUMMARY

The present disclosure provides a flexible board which can be easily bent and cannot be easily ripped and an electronic apparatus having the flexible board.

According to the present disclosure, a flexible board includes: a base film on which a wiring pattern is formed; a first cover film, which is located on one surface of the base film; and a second cover film, which is located on the other surface of the base film, wherein a bending portion, which is bent when mounting the flexible board on an electronic apparatus, includes both edges on which the first cover film is formed and a central portion from which the base film is exposed.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

Hereinafter, a flexible board 10 according to an embodiment of the present disclosure will be described with reference to the accompanying drawings. The following configuration is only an example for easy understanding of the disclosure, and does not limit the disclosure unless particularly mentioned.

Figure 1:
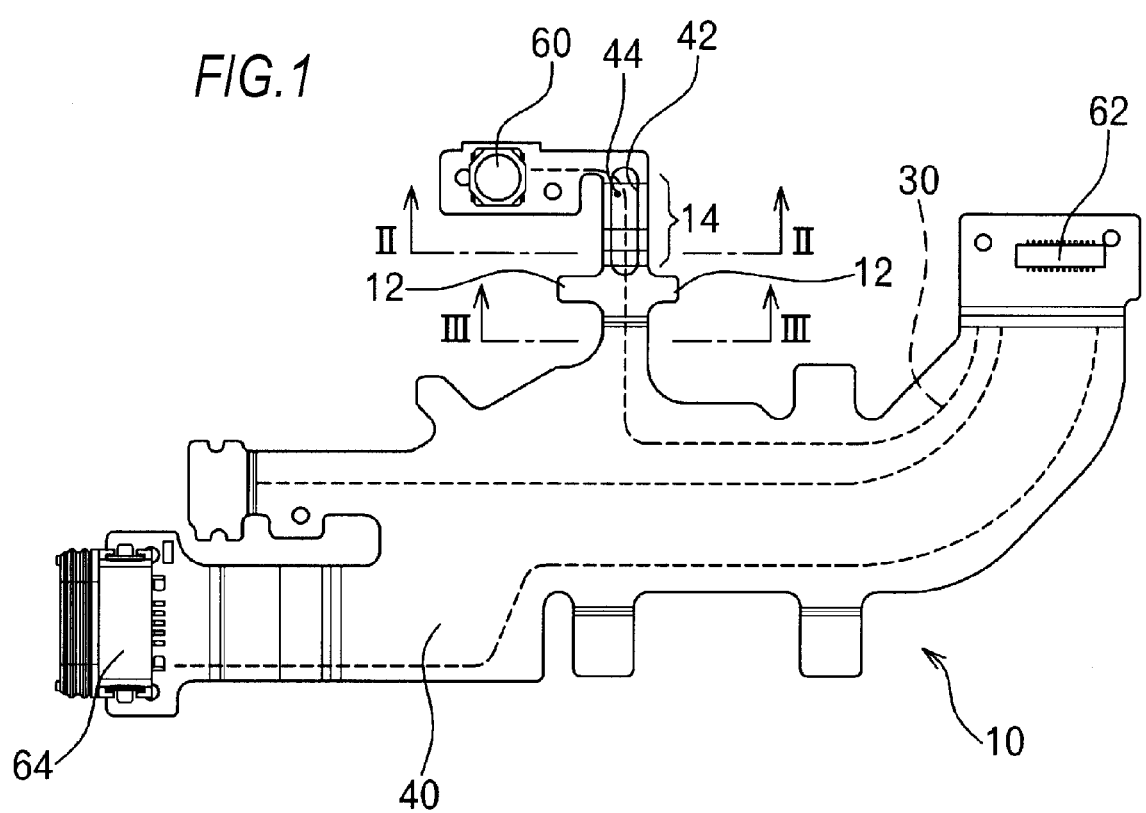
FIG. 1 illustrates a plan view of a flexible board according to an embodiment of the present disclosure.
Figure 2:
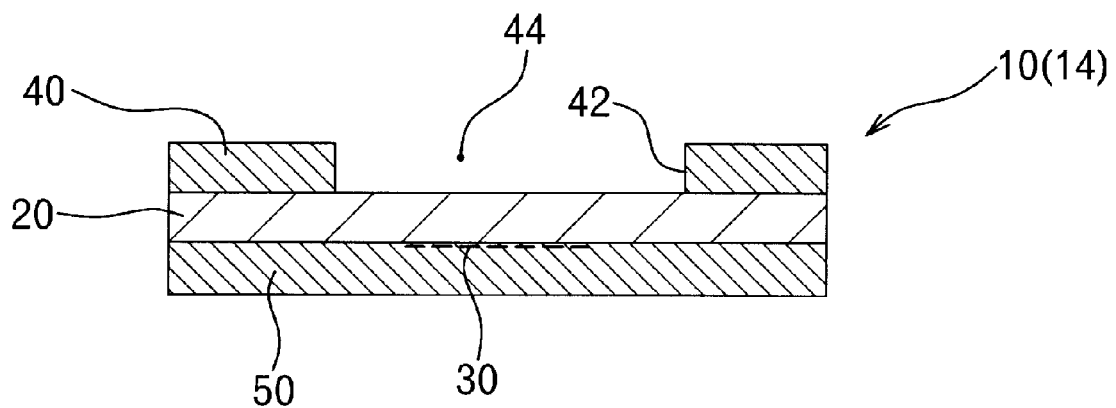
FIG. 2 illustrates a cross-sectional view taken along line II-II in FIG. 1.
Figure 3:
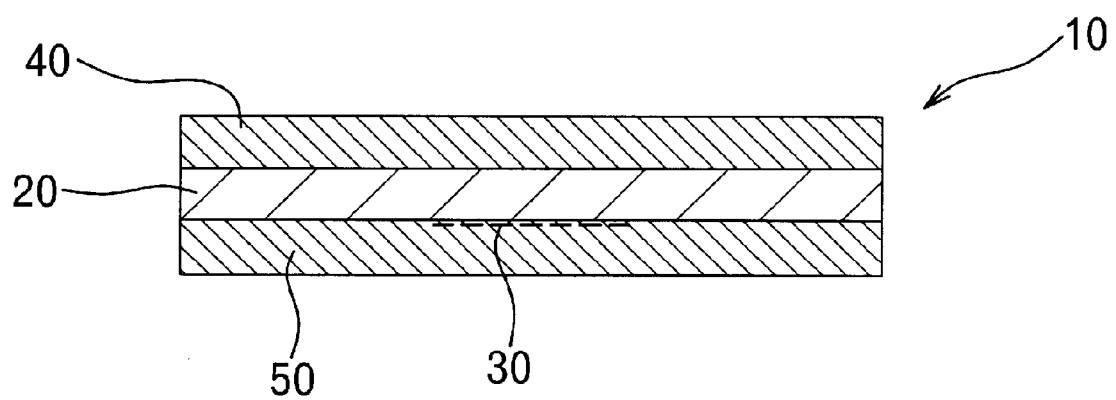
FIG. 3 illustrates a cross-sectional view taken along line III-Ill in FIG. 1.

FIG. 1 is a plan view of a flexible board 10 (flexible printed circuit board) according to an embodiment of the present disclosure. FIG. 2 is a cross-sectional view taken along line II-II in FIG. 1. FIG. 3 is a cross-sectional view taken along line III-Ill in FIG. 1.

In the flexible board 10, as illustrated in FIGS. 1 to 3, one surface of a base film 20, on which a wiring pattern 30 is formed, is covered with a first cover film 40 and the other surface thereof is covered with a second cover film 50.

Plural electronic components 60, 62, and 64 are mounted on the flexible board 10. In the embodiment illustrated in the drawings, reference numeral 60 denotes a side-button tact switch, reference numeral 62 denotes a board-connection connector, and reference numeral 64 denotes a USB connector. The present disclosure is not limited to these electronic components. The electronic components 60, 62, and 64 can be mounted by using an adhesive sheet.

The base film 20 is formed of an insulating resin such as a polyimide resin. For example, the thickness of the base film 20 can be set to be in a range of 5 μm to 50 μm. In the embodiment illustrated in the drawings, the thickness of the base film 20 is 12.5 μm.

As illustrated in FIG. 1, the wiring pattern 30 is formed on the base film 20 depending on the electronic components 60, 62, and 64 which are mounted on the flexible board 10. For example, the wiring pattern 30 is formed of a copper foil.

The first cover film 40 is formed on one surface of the base film 20. The first cover film 40 is also formed of an insulating resin such as a polyimide resin and the thickness thereof can be set to be in a range of 5 μm to 50 μm. In the embodiment illustrated in the drawings, the thickness of the first cover film 40 is 12.5 μm.

The first cover film 40 is bonded to the base film 20 using an adhesive.

The second cover film 50 is formed on the other surface of the base film 20. The second cover film 50 is also formed of an insulating resin such as a polyimide resin, and the thickness thereof can be set to be in a range of 5 μm to 50 μm. In the embodiment illustrated in the drawings, the thickness of the second cover film 50 is 12.5 μm.

The wiring pattern 30 and the second cover film 50 are bonded to the base film 20 using an adhesive.

As necessary, a ground conductive layer, an electromagnetic wave-shielding layer, and the like may be additionally formed on the flexible board 10.

In order to mount the flexible board 10 on an electronic apparatus, a positioning locking piece 12 or a screwing hole may be formed in the flexible board 10.

In practice, the flexible board 10 is bent and disposed depending on restriction in the shape of the electronic apparatus, the arrangement of other electronic components, or the like.

In FIG. 1, a portion denoted by reference numeral 14 in the flexible board 10 is a bending portion, which is bent in FIGS. 4 and 5 to be described later.

In the bending portion 14, as illustrated in FIGS. 1 and 2, the first cover film 40 is formed on only both edges of the base film 20. The first cover film 40 can be formed on only both edges of the bending portion, for example, by forming a through-hole 42 at a position of the first cover film 40 corresponding to the bending portion 14 in advance and bonding the first cover film 40 to the base film 20.

The size of the through-hole 42 can be appropriately set depending on the radius of curvature of the bending portion 14. In FIG. 1, the bending portion 14 has a corner-rounded rectangular shape having rounded corners, but may have a circular shape, an elliptical shape, a rectangular shape, or the like.

The bending portion 14 is employed for a part requiring bending of the flexible board 10. In this embodiment, the bending portion 14 is formed, for example, in a place in which a wiring pattern is not formed between the first cover film 40 and the base film 20. Examples of the place in which the wiring pattern is not formed between the first cover film 40 and the base film 20 include places in which an amount of wiring patterns is small such as a wiring pattern to a switch such as the side-button tact switch, a wiring pattern to the USB connector, and a wiring pattern to a light-emitting portion such as an LED. A wiring pattern may be formed between the first cover film 40 and the base film 20 on both edges. A wiring pattern may be formed between the second cover film 50 and the base film 20.

As described above, the first cover film 40 in the bending portion 14 is formed on both edges of the base film 20, the base film 20 is exposed from the central portion 44, and the first cover film 40 is not formed in the central portion. Accordingly, the thickness of a portion except both edges in the bending portion 14 can decrease by the thickness of the first cover film 40 and thus bending rigidity thereof can be reduced. Accordingly, the flexible board 10 can be easily bent in the bending portion 14 and a restoring force thereof can be suppressed. As a result, the flexible board 10 or the electronic component 60 mounted on the flexible board 10 can be easily attached, and even after the electronic component 60 is attached, it is possible to suppress the electronic component 60 from departing from the electronic apparatus 70 due to the restoring force of the flexible board 10 (particularly, the restoring force resulting from the first cover film 40).

Since the first cover film 40 is formed on both edges of the bending portion 14, the bending portion has resistance to a ripping from an edge. Accordingly, when the electronic component 60 is mounted on the flexible board 10 using an adhesive sheet (not illustrated) and then a strong force is applied to the bending portion 14 in removing the electronic component 60 from the flexible board 10, the flexible board can be configured to have a resistance to a ripping from an edge because of presence of the first cover film 40, in comparison with a case in which the first cover film 40 is not formed.

Figure 4:
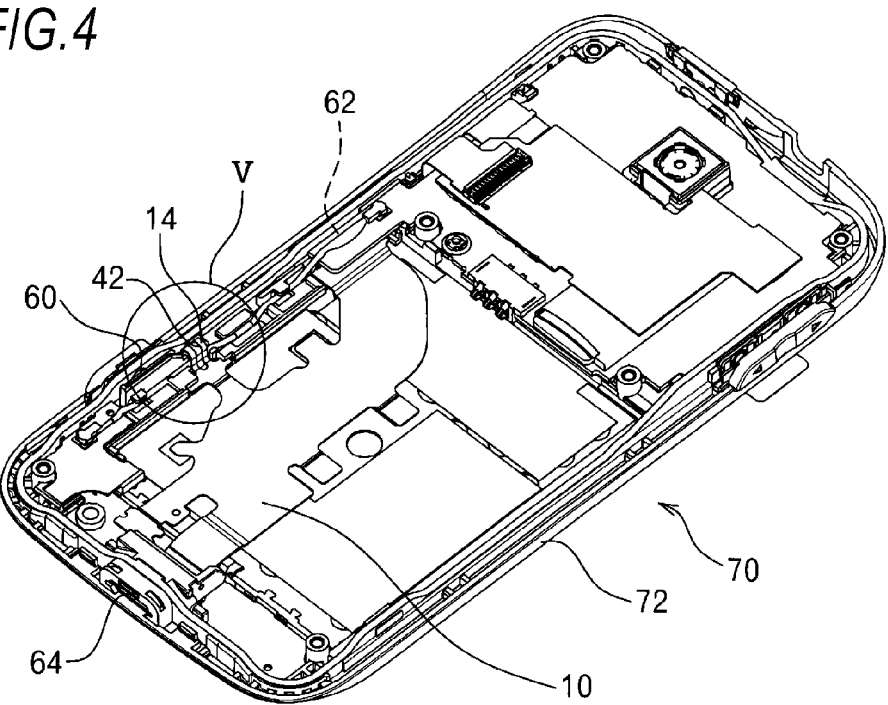
FIG. 4 illustrates a perspective view illustrating an internal configuration of an electronic apparatus on which the flexible board according to the embodiment of the present disclosure is mounted.

FIG. 4 illustrates an internal configuration of the electronic apparatus 70 on which the flexible board 10 according to the embodiment of the present disclosure is mounted. In the drawing, the electronic apparatus 70 is a smartphone, but may be a mobile phone, a person digital assistant (PDA), a tablet type terminal, a portable music player, or a portable game machine except for the smartphone. The present disclosure is not limited to these electronic apparatuses.

Figure 5:
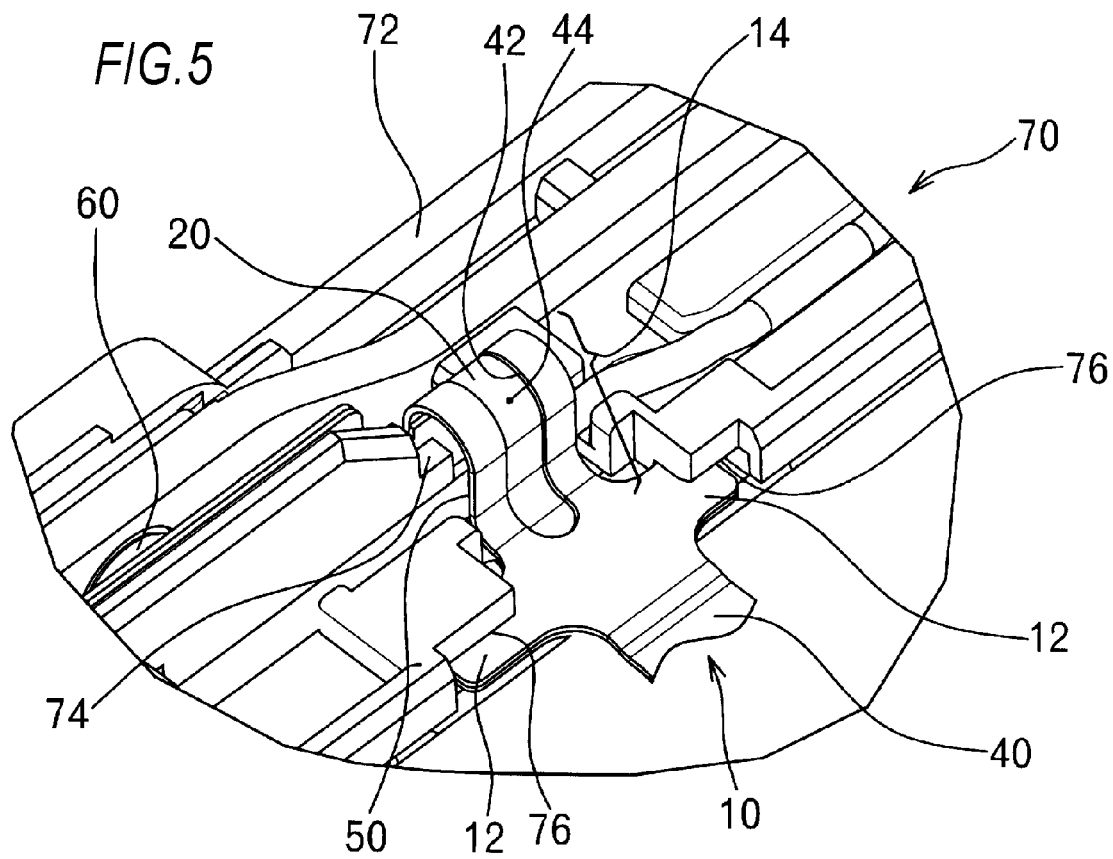
FIG. 5 illustrates an enlarged view of a circularly-encircled part V in FIG. 4.

As illustrated in FIG. 5, a rib 74 for mounting the electronic component 60 or the like is formed to protrude from a casing 72 of the electronic apparatus 70, and the flexible board 10 is bent and attached to go over the rib 74.

More specifically, the flexible board 10 can be attached by inserting the positioning locking piece 12 into a concave portion 76 formed in the casing 72.

By attaching the flexible board 10 to the electronic apparatus 70, the electronic component 60 can also be appropriately attached to a predetermined position of the electronic apparatus 70.

In the embodiment illustrated in FIG. 4, after the flexible board 10 is attached, the flexible board 10 is disposed to bend the bending portion 14 in a U shape and to expose the electronic component 60 from an end face of the casing 72 as enlarged and illustrated in FIG. 5.

Since the first cover film 40 is formed on only both edges of the bending portion but the first cover film 40 is not formed in the central portion 44 thereof, the bending portion 14 has small bending rigidity. Accordingly, the flexible board can be easily bent in the bending portion 14. When the electronic component 60 is attached and fixed to the casing 72, the restoring force is small and it is thus possible to suppress the electronic component 60 from departing from the electronic apparatus 70 due to the restoring force of the flexible board 10.

In addition, since the bending portion 14 has appearance different from the other portions, the bent position can be visually recognized in assembling the electronic apparatus 70.

The first cover film 40 is formed on both edges of the bending portion 14. Accordingly, even when a strong force is applied to the bending portion 14 in detaching the electronic component 60 from the flexible board 10 in maintenance or the like of the electronic apparatus 70, the flexible board 10 is not ripped easily because of presence of the first cover film 40 on both edges.

The configurations of the elements in the present disclosure are not limited to the above-mentioned embodiment, but can be modified in various forms within the technical scope described in the appended claims.

For example, the materials or the thicknesses of the base film 20 and the cover films 40 and 50 of the flexible board 10 are not limited to the above-mentioned embodiment. The layer structure of the flexible board 10 is not limited to the above-mentioned embodiment.

What is claimed is:

1. An electronic apparatus comprising:
a casing including a rib and a concave portion formed in a vicinity of the rib:
a flexible board comprising: a base film, on which a wiring pattern is formed; a first cover film, which is located on one surface of the base film; and a second cover film, which is located on the other surface of the base film, wherein a bending portion, which is bent when mounting the flexible board on an electronic apparatus, includes both edges on which the first cover film is formed and a central portion from which the base film is exposed, wherein the first cover film includes positioning locking pieces which protrude toward opposite sides, and wherein one end of the central portion is located between the positioning locking pieces; an electronic component that is mounted on the flexible board, and wherein the flexible board is attached to the casing by inserting the positioning locking piece into the concave portion and bending the bending portion with going over the rib, and wherein the electronic component is attached to the flexible board.

2. The flexible board according to claim 1,
wherein the wiring pattern in the bending portion is not located between the first cover film and the base film but the wiring pattern is located between the second cover film and the base film.

3. The flexible board according to claim 1,
wherein the first cover film includes a through-hole in a place corresponding to the central portion and the through-hole includes a rectangular shape having rounded corners.

4. The flexible board according to claim 1,
wherein the wiring pattern within the bending portion is formed between the base film and the second cover film, and
wherein the wiring pattern within the bending portion is formed only in an area corresponding to the central portion.

5. The electronic apparatus according to claim 1, wherein the electronic component is at least one of a switch and a connector.

\* \* \* \* \*

UNITED STATES PATENT AND TRADEMARK OFFICE
CERTIFICATE OF CORRECTION

| | | |
|---|---|---|
| PATENT NO. | : 9,706,657 B2 | Page 1 of 1 |
| APPLICATION NO. | : 14/969585 | |
| DATED | : July 11, 2017 | |
| INVENTOR(S) | : Kengo Suzuki et al. | |

It is certified that error appears in the above-identified patent and that said Letters Patent is hereby corrected as shown below:

On the Title Page

Change Item (63) Related U.S. Application Data to:
--Continuation of application No. PCT/JP2014/065130, filed on Jun. 6, 2014.--

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*